United States Patent
Kondo

(10) Patent No.: US 9,085,831 B2
(45) Date of Patent: Jul. 21, 2015

(54) BUNDLE OF LONG THIN CARBON STRUCTURES, MANUFACTURING METHOD THEREFOR, AND ELECTRONIC DEVICE

(75) Inventor: Daiyu Kondo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/278,347

(22) Filed: Oct. 21, 2011

(65) Prior Publication Data

US 2012/0040523 A1    Feb. 16, 2012

Related U.S. Application Data

(62) Division of application No. 11/949,349, filed on Dec. 3, 2007.

(30) Foreign Application Priority Data

Dec. 1, 2006    (JP) ................................. 2006-325297

(51) Int. Cl.
     B32B 9/00      (2006.01)
     D01F 9/127      (2006.01)
     (Continued)

(52) U.S. Cl.
     CPC ............... *D01F 9/127* (2013.01); *B01J 21/063* (2013.01); *B01J 23/74* (2013.01); *B01J 23/75* (2013.01); *B01J 27/24* (2013.01); *B82Y 30/00* (2013.01); *B82Y 40/00* (2013.01); *C01B 31/022* (2013.01); *C01B 31/0233* (2013.01); *C23C 16/0272* (2013.01); *C23C 16/26* (2013.01); *D01F 9/1275* (2013.01); *H01B 1/04* (2013.01); *H01L 21/76838* (2013.01); *H01L 21/76876* (2013.01); *H01L 21/76879* (2013.01); *H01L 23/373* (2013.01); *H01L 23/53276* (2013.01); *H01L 24/13* (2013.01); *C01B 2202/06* (2013.01);
     (Continued)

(58) Field of Classification Search
     CPC .............. C01B 31/022–31/0293; C01B 31/04; Y10T 428/30; Y10S 977/742
     USPC .................... 428/408; 423/447.1, 447.2, 448; 427/29; 977/742
     See application file for complete search history.

(56) References Cited

U.S. PATENT DOCUMENTS 6,858,197 B1 * 2/2005 Delzeit ...................... 423/447.3
7,056,479 B2    6/2006 Dodelet et al.
(Continued)

FOREIGN PATENT DOCUMENTS

JP      2002-329723 A    11/2002
JP      2003-012312 A    1/2003
(Continued)

OTHER PUBLICATIONS

Japanese Office Action dated Nov. 29, 2011, issued in corresponding Japanese Patent Application No. 2006-325397.
(Continued)

*Primary Examiner* — Daniel H Miller
(74) *Attorney, Agent, or Firm* — Westerman, Hattori, Daniels & Adrian, LLP

(57) ABSTRACT

In the bundle of long thin carbon structures of the present invention, end parts of the bundle are interconnected in a carbon network. The interconnected end parts form a flat surface. By this, an electrical connection structure with low resistance and/or a thermal connection structure with high thermal conductivity are obtained. The bundle of long thin carbon structures can be used suitably as a via, heat removal bump or other electronic element.

11 Claims, 10 Drawing Sheets

(51) Int. Cl.
*C01B 31/02* (2006.01)
*B82Y 30/00* (2011.01)
*B82Y 40/00* (2011.01)
*C23C 16/02* (2006.01)
*C23C 16/26* (2006.01)
*H01L 21/768* (2006.01)
*H01L 23/373* (2006.01)
*H01L 23/532* (2006.01)
*B01J 23/75* (2006.01)
*H01B 1/04* (2006.01)
*B01J 21/06* (2006.01)
*B01J 23/74* (2006.01)
*B01J 27/24* (2006.01)
*H01L 23/00* (2006.01)

(52) U.S. Cl.
CPC ......... *C01B2202/08* (2013.01); *C01B 2202/22* (2013.01); *H01L 24/16* (2013.01); *H01L 2224/13078* (2013.01); *H01L 2224/13193* (2013.01); *H01L 2224/16225* (2013.01); *H01L 2224/16227* (2013.01); *H01L 2924/13064* (2013.01); *Y10T 428/30* (2015.01)

(56) References Cited

U.S. PATENT DOCUMENTS

| | | | |
|---|---|---|---|
| 7,084,507 | B2 | 8/2006 | Awano |
| 2004/0053780 | A1* | 3/2004 | Jiang et al. ............... 502/182 |
| 2004/0151653 | A1 | 8/2004 | Ando et al. |
| 2005/0266764 | A1* | 12/2005 | Kim et al. ............... 445/24 |
| 2006/0226551 | A1 | 10/2006 | Awano |
| 2010/0124526 | A1 | 5/2010 | Ando et al. |

FOREIGN PATENT DOCUMENTS

| | | |
|---|---|---|
| JP | 2005-22885 A | 1/2005 |
| JP | 2006-229297 A | 8/2006 |

OTHER PUBLICATIONS

Japanese Office Action dated Nov. 29, 2011, issued in corresponding Japanese Patent Application No. 2006-325297 (w/English Translation).

T. Iwai et al, "Thermal and Source Bumps Utilizing Carbon Nanotubes for Flip-chip High Power Amplifiers," IEEE IEDM, Technical Digest, 2005, pp. 257-260.

Mizuhisa Nihei et al, "Electrical Properties of Carbon Nanotube Bundles for Future Via Interconnects," Japanese Journal of Applied Physics; vol. 44; No. 4A; 2005; pp. 1626-1628.

Mizuhisa Nihei et al, "Simultaneous Formation of Multiwall Carbon Nanotubes and their End-Bonded Ohmic Contacts to Ti Electrodes for Future ULSI Interconnects," Japanese Journal of Applied Physics; vol. 43; No. 4B; 2004; pp. 1856-1859.

Japanese Office Action dated Oct. 1, 2013 corresponding to Japanese Application No. 2006-325297 in English Translation. (1 page).

* cited by examiner

BUNDLE OF LONG THIN CARBON STRUCTURES, MANUFACTURING METHOD THEREFOR, AND ELECTRONIC DEVICE

CROSS-REFERENCE TO RELATED APPLICATIONS

This application is a divisional application of U.S. application Ser. No. 11/949,349, filed Dec. 3, 2007, based upon and claims the benefit of priority from the prior Japanese Patent Application No. 2006-325297, filed on Dec. 1, 2006, the entire contents of which are incorporated herein by reference.

BACKGROUND OF THE INVENTION

1. Field of the Invention

The present invention relates to a bundle of long thin carbon structures. More specifically, it relates to a bundle of long thin carbon structures that can be used as an electronic element for various electronic devices.

2. Description of the Related Art

In recent years, so-called carbon nanotubes (CNTs) and other tubular carbon materials discovered among carbon fibers have been studied as electronic elements with the properties of electrically conductive and thermally conductive bodies for use in semiconductor integrated circuit devices including semiconductor devices, and printed circuit boards and other various electronic devices {see for example Japanese Patent Application Laid-open No. 2005-022885 (Claims)}.

There has been particular interest in CNTs as materials for forming semiconductor devices because of their excellent chemical stability and unique physical, electrical and other properties, and research continues into means of controlling their thickness and length, formation position, chirality and the like.

FIG. 11 shows one example of a wiring via structure using such CNTs (see for example Japanese Patent Application Laid-open No. 2002-329723 (Claims) and Nihei et al., Japanese Journal of Applied Physics, 2005, Vol. 44, p. 1626). As shown in FIG. 11, such a via structure can be prepared, for example, by forming an underlayer 2 and a Cu wiring layer 3 on a substrate 1, then depositing a barrier layer 4 (Ta film or the like) on this Cu wiring layer 3 to prevent dispersion of Cu, and then forming an insulating layer 5 on top, then forming a via hole, depositing a catalytic metal support film 6 (a Ti film for example) and a catalytic metal film 7 of a material such as Co by sputtering or the like, then growing CNTs 8 by chemical vapor deposition (CVD) or the like using hydrocarbon gas ($CH_4$, $C_2H_2$, etc.), and then forming upper wiring.

In the conventional CNT wiring, the contact between the CNT wiring extending from the via and the upper wiring generally has a structure in which a metal electrode is simply vapor deposited on the CNTs grown out of the via.

However, it has been shown that a via with such a structure does not make effective use of the good electrical properties of the CNTs themselves because high contact resistance occurs between the CNTs and the upper wiring.

One reason for this has to do with the uneven lengths of the individual CNTs. As a result, the ends of the CNTs are not aligned, making it difficult to form a uniform contact between all CNTs and the electrode metal. One method of solving these problems is to polish the ends flat, but although a superficial flatness can be achieved by reducing the CNTs through polishing until they are aligned with the via, this does not completely solve the problem of uneven length, and it has been found that this would not necessarily be a suitable method since it causes cracking and other physical damage to the CNTs themselves.

The same problem exists when CNTs are used as thermally conductive materials in heat removal bumps for example. That is, because the ends of the CNTs are not uniform or aligned, their good thermal conductivity may be greatly reduced when they are brought into contact with another material.

SUMMARY OF THE INVENTION

One aspect of the present invention provides a bundle of long thin carbon structures interconnected at end parts on one side in a carbon network.

Another aspect of the present invention provides an electronic elementelectronic device that uses the aforementioned bundle of long thin carbon structures as an electrically conductive material or thermally conductive material, or electrically and thermally conductive material.

Yet another aspect of the present invention provides a method for manufacturing a bundle of long thin carbon structures by chemical vapor deposition, wherein the ends of the grown bundle of long thin carbon structures are made to interconnect in a carbon network by adjusting at least one condition selected from the degree of vacuum, raw material composition, catalyst composition, catalyst layer film thickness, catalyst support layer composition, catalyst support layer film thickness, growth temperature, dilute gas composition, gas flow amount and dilute gas concentration.

DESCRIPTION OF THE PREFERRED EMBODIMENTS

Figure 1:
FIG. 1 is a scanning electron microscope image of the initial stage of growth of a bundle of long thin carbon structures.

Embodiments of the present invention are explained below using drawings, examples and the like. These drawings, examples and the like and explanations serve as examples of the present invention, and do not limit its scope. Of course, other embodiments may be included in the present invention to the extent that they match the intent of the present invention.

The following explanation pertains primarily to cases in which electrically conductive effects are desired (such as in the case of an electrical connection structure with low resistance), but of course the present invention may also be applied to cases in which thermally conductive effects rather than electrically effects are desired or to cases in which the object is to achieve both kinds of effects simultaneously.

It has been shown that in a bundle of long thin carbon structures interconnected in a carbon network at end parts on one side, good electric conductivity with an electroconductive material can be obtained when the electroconductive material is formed on those ends. "Interconnected in a carbon network at end parts" here means a state in which the end parts of the long thin carbon structures forming the bundle of long thin carbon structures are confirmed from a microscopic image or the like to be connected to each other. This state is similar to that of a monolayer or multilayer graphite sheet. That is, the bundle of long thin carbon structures of the present invention has a structure of columns projecting from a carbon network in a monolayer or multilayer graphite sheet form.

The good electrical conductivity mentioned above is considered to be attributed to the fact that the end parts of the bundle of long thin carbon structures are interconnected in a carbon network and thus form a reliable electrical contact with a conductive material formed on top. It is thought that when these long thin carbon structures are applied to via wiring for example, because the structures are uniform in length and the end parts are aligned by being connected to one another, a contact forms easily between the bundle of long thin carbon structures and the conductive material on top. The absence of polishing or other processing makes it possible to avoid physical or chemical damage to the long thin carbon structures. Because the end parts are interconnected in a carbon network as in a graphite sheet, moreover, they are also connected electrically and thermally, which also serves to improve the contact.

The conductive material in this case is not particularly limited, and examples include aluminum (Al), copper (Cu), gold (Au), silver (Ag), platinum (Pt), titanium (Ti), titanium nitride (TiN), tantalum (Ta), tantalum nitride (TaN), tungsten (W), palladium (Pd), polysilicon and the like. The thickness of the electroconductive material is not particularly limited but is generally in the range of 1 to 1000 nm in the case of wiring for a semiconductor integrated circuit device. The method of preparing the electroconductive material in the present invention is not particularly limited, and a known method such as plating or sputtering can be selected.

A typical example of a "long thin carbon structure" in the present invention is a CNT, but other sizes and shapes are also possible as long as the structure is an electrically conductive and/or thermally conductive body with a long thin shape that is made principally of carbon. The phrase "A and/or B" in the present invention includes cases of A alone, B alone, and A and B together.

CNTs includes those that assume a band structure fulfilling the conditions for exhibiting metallic properties, and those that assume a band structure fulfilling the conditions for exhibiting semiconductor properties. A CNT of the present invention is preferably one exhibiting metallic properties, particularly a multilayer CNT.

A CNT of the present invention may also be formed as a so-called pea-pod nanotube comprising nanostructures other than nanotubes (such as fullerenes encapsulating metal) packed inside a CNT.

The electrical conductivity or mechanical strength of a via can be enhanced through the use of such a pea-pod nanotube containing other nanostructures.

Structures other than nanotubes, molecules, or atoms may also be present between adjacent nanotubes making up a via rather than within the nanotubes, in a way similar to metal-encapsulating fullerenes. Such structures other than the nanotubes, molecules or atoms may also be included between adjacent nanotubes containing metal fullerenes.

Arc discharge and laser ablation have conventionally been used to form CNTs and other long thin carbon structures, but currently plasma CVD (plasma chemical vapor deposition) and thermal CVD are often used. Because the nanotubes can be formed directly on a substrate by CVD, this method is expected to be suited to the manufacture of integrated circuits.

In the case of formation by CVD, a catalyst support layer and a catalytic thin film layer for producing the long thin carbon structures are generally layered on a substrate. It is known that the long thin carbon structures are formed on the substrate around nuclei of catalytic fine particles that are produced from the catalytic thin film by heating in CVD, but in the present invention the catalyst is not converted to fine particles before the long thin carbon structures are formed.

The bundle of long thin carbon structures of the present invention is preferably prepared by CVD in this way, and in this case the bundle of long thin carbon structures is produced on a substrate, but it is not a necessary condition of the present invention that the bundle of long thin carbon structures be produced on a substrate. That is, there are no particular limits as to the disposal of the other end parts (base parts) that are not the end parts interconnected in the bundle of long thin carbon structures.

When preparing the bundle of long thin carbon structures of the present invention by CVD, there are no particular limitations on the material forming the substrate and a known material can be selected as appropriate, but it is desirable to use an electrically conductive material when electrical conductivity is desired and a thermally conductive material when thermal conductivity is desired.

The catalyst for preparing the bundle of long thin carbon structures of the present invention by CVD can be selected appropriately from known catalysts according to the long thin carbon structures used. Examples include metals selected from the group consisting of cobalt (Co), nickel (Ni), iron (Fe), palladium (Pd), platinum (Pt) and alloys containing these. When the long thin carbon structures are CNTs, Co, Ni or Fe or an alloy containing these is particularly desirable.

The thickness of the catalytic thin film is not particularly limited but is preferably in the range of 0.5 to 3 nm for the purpose of forming CNTs.

There are no particular limits on the method of depositing the catalytic thin film, which may be deposited on the catalyst support layer by a method such as vacuum deposition, sputtering, CVD or the like. When the bundle of long thin carbon structures of the present invention is prepared by CVD, the catalytic thin film is the nucleus for growing the long thin carbon structures, so a uniform film thickness is important for controlling the diameters and formation positions of the long thin carbon structures. In general, the film should be deposited with a uniform distribution on the catalyst support layer.

The catalyst support layer used for preparing the bundle of long thin carbon structures of the present invention by CVD is a layer on which the catalytic thin film layer for producing the long thin carbon structures is or has been deposited. The material for forming this catalyst support layer can be selected appropriately from known materials, but an electrically conductive material is preferable for obtaining electrical conductivity and a thermally conductive material for obtaining thermal conductivity. For obtaining both electrical and thermal conductivity, it may be a monolayer body or a multilayer body comprising two or more layers comprising at least one or more materials selected from the group consisting of titanium (Ti), tantalum (Ta), molybdenum (Mo), aluminum (Al), HfN, ZrN, TiN, TaN and TiSi. Like the conductive material formed at the end parts of the bundle of long thin carbon structures, the structure immediately beneath the catalyst support layer may be aluminum (Al), copper (Cu), gold (Au), silver (Ag), platinum (Pt), titanium (Ti), titanium nitride (TiN), tantalum (Ta), tantalum nitride (TaN), tungsten (W), palladium (Pd) or a multilayer body of these in the case of an electrode structure for via wiring or the like for example.

The thickness of the catalyst support layer of the present invention is not particularly limited but is generally in the range of 0.5 to 50 nm. There are no particular limits on the method of preparing the catalyst support layer of the present invention, which may be formed by vacuum deposition, sputtering, CVD or the like.

The catalytic thin film layer is deposited on the catalyst support layer before forming the long thin carbon structures. However, there are cases in which the catalytic thin film converts to fine particles and the particles move (for example to the end parts of the long thin carbon structures) as the long thin carbon structures are being formed. Even when the catalytic fine particles are at the substrate of the CNT, moreover, it is considered that direct contact may still occur between the catalyst support layer and the CNTs, and in this case it is possible to obtain good electric conductivity with the substrate when the catalyst support layer is itself electrically conductive, for example. In this way, good electrical contact with another element is possible at the other end parts (base parts) opposite the "interconnected end parts" of the bundle of long thin carbon structures of the present invention. Of course, such cases in which good electrical contact with another element is achieved by another means are also included in the scope of the present invention.

A low-resistance electrical connection structure can be obtained using the long thin carbon structures of the present invention. It is also possible to enhance resistance to migration, which is a cause of circuit breakage. The long thin carbon structures of the present invention are particularly useful in cases of high aspect ratio, as in a via hole.

For example, when aluminum or copper is used as a via hole packing material, there is a problem of movement of metal atoms of the wiring material, which is known as migration. This is a line breakage phenomenon caused by stress to electroconductive materials and/or by electrons flowing through the wiring, and is particularly common in via parts and in wiring that has an unavoidably complex structure. Migration caused by stress is called stress migration, while migration caused by electrons flowing through the wiring is called electromigration. Migration resistance is also closely related to the thermal conductive ability of the electroconductive material, and migration resistance declines when thermal conductivity is poor so that the electroconductive material heats up.

By contrast, when CNTs are used as the via hole packing material, for example, they have high stress migration resistance due to their excellent mechanical strength and high electromigration resistance due to their high thermal conductivity and resistance to high current densities. They also have good thermal conductive ability due to the good thermal conductivity of carbon. The long thin carbon structures of the present invention are advantageous also in this regard.

The bundle of long thin carbon structures of the present invention is useful in cases of high aspect ratio, such as in via holes, because it is a long thin structure. In particular, when preparing a CNT bundle by CVD, because the CNTs are formed by self-organization on the catalytic thin film layer, they are resistant to the effect of aspect ratio, and it is possible to arrange hundreds or more (tens of thousands for example) of CNTs with a tube diameter of 1 to 50 nm standing together in large numbers in a via hole with a diameter of 2 μm for example. Thus, the bundle of long thin carbon structures of the present invention is advantageous.

A bundle of long thin carbon structures signifies long thin carbon structures standing together in large numbers in this way. The thickness, length and aspect ratio of the long thin carbon structures and bundle of long thin carbon structures are not particularly limited. In the case of a CNT bundle formed by CVD, an aspect ratio of about 100 can be easily achieved.

There are no particular limits on the method of obtaining this structure, but it has been shown as a result of various studies in the manufacture of the structures of bundles of long thin carbon structures formed by CVD that end parts of the long thin carbon structures in the bundle can be easily interconnected in a carbon network by appropriately selecting such conditions as the degree of vacuum, material composition, catalyst composition, catalyst layer thickness, catalyst support layer composition, catalyst support layer thickness, growth temperature, dilute gas composition, gas flow amount, dilute gas concentration and the like.

Figure 2:
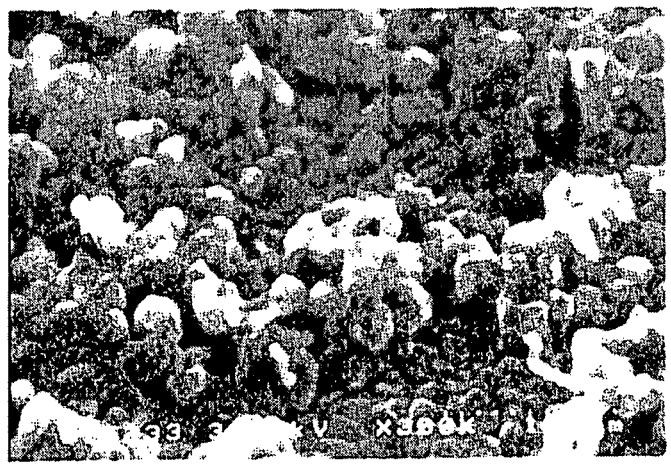
FIG. 2 is a scanning electron microscope image of the intermediate stage of growth of a bundle of long thin carbon structures.
Figure 3:
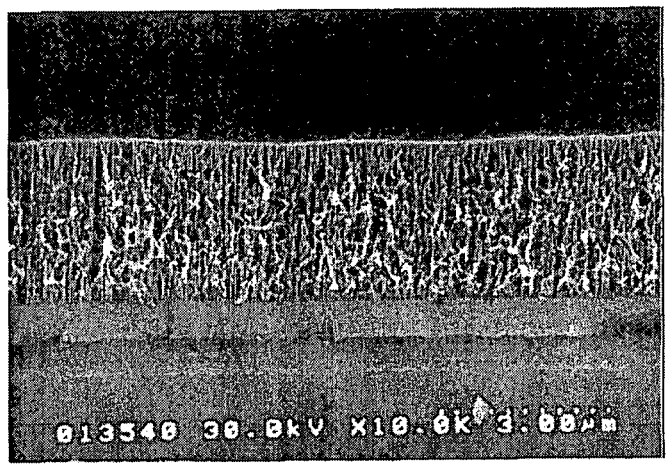
FIG. 3 is a cross-sectional scanning electron microscope image showing the end parts of a bundle of long thin carbon structures interconnected in a carbon network as a result of growth of the bundle of long thin carbon structures at 510° C.

This is explained using the scanning electron microscope images of FIGS. 1 to 4. FIG. 1 shows the initial stage of the growth of a bundle of long thin carbon structures, FIG. 2 the intermediate stage of growth, and FIG. 3 a state in which end parts of the long thin carbon structures in the bundle are interconnected in a carbon network as a result of growth (cross-section perpendicular to substrate). In FIG. 3 the substrate is at the bottom, while the top forms a flat surface. When seen from above, this flat surface is visually recognized as the substrate color or as a whitish color with differences depending on the length and density. By contrast, conventional CNTs are recognizable as a blackish color with differences in shade depending on length and density.

Figure 4:
FIG. 4 is a scanning electron microscope image showing an enlarged view of the interconnected structure of the end parts in FIG. 3.
Figure 5:
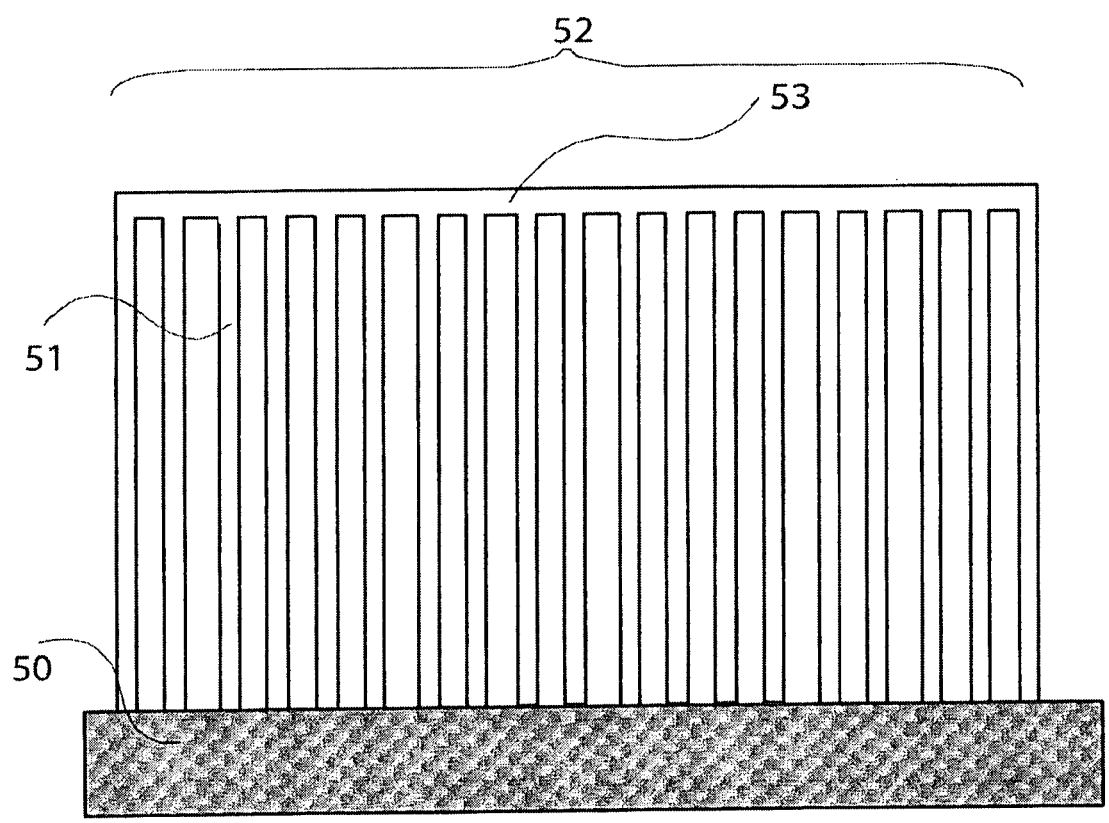
FIG. 5 is a model view of a bundle of long thin carbon structures as seen from the side.

It can be seen from FIGS. 1, 2 and 3 that as the long thin carbon structures grow the end parts connect to one another, so that finally, as shown in model view in FIG. 5, the end parts 53 of a bundle of long thin carbon structures 52 (which is a bundle of long thin carbon structures 51 grown on a substrate 50) form a structure connected in a carbon network. FIG. 4 is an enlarged view showing the structure of the end parts interconnected in a carbon network in FIG. 3. It can be seen from FIG. 4 that each of the long thin carbon structures becomes thicker near the end before forming the interconnected carbon network structure.

FIG. 3 shows clearly how the long thin carbon structures stand together in large numbers to form a bundle of long thin carbon structures.

In the bundle of long thin carbon structures of the present invention, it is desirable as shown in the photographs that the long thin carbon structures extend in the same direction, that each be a single long thin carbon structure extending from its interconnected end part to the other end, and that they not be twisted or tilted. These conditions are important for obtaining good electrical conductivity. To confirm that the long thin carbon structures each extend from the interconnected end parts to the other ends (base parts) and are not twisted or tilted, it is sufficient to observe the bundle of long thin carbon structures visually from the side under enlargement in such an SEM image or the like. That is, in the case of FIG. 3 for example, these conditions can be considered fulfilled if the structures appear to be aligned overall in a bundle from top to bottom.

From this, it would seem desirable that the interconnected end parts of the long thin carbon structures form a flat surface consisting of a carbon network. Flat here means that no large dips or bumps appear in an SEM image as shown in FIG. 3. More specifically, it is considered to be sufficient that the surface formed by the interconnected end parts of the long thin carbon structures has a mean surface roughness (Ra) of 10 nm or less for an area of 500 nm×500 nm as measured by atomic force microscopy (AFM) in tapping mode. It has been found from electron microscopy, XPS (x-ray photoelectron spectroscopy), EDX (energy dispersive x-ray analysis) and the like that the end parts of the long thin carbon structures are connected in a carbon network in a way similar to a graphite sheet.

A visual test such as that described above can be used to determine whether the bundle of long thin carbon structures of the present invention has been obtained, but it is also important that the interconnected end parts and the middle parts of the bundle of long thin carbon structures be electrically, thermally or electrically and thermally connected in the bundle of long thin carbon structures of the present invention, and this can also be confirmed. Electrical connection can be determined from electrical resistance, and thermal connection from thermal conductivity. The degree of electrical resistance or thermal conductivity in this case can be set as appropriate depending on the circumstances, but in general they should be preferably equivalent or less (or more in the case of thermal conductivity) to those of an electroconductive material used in an electronic circuit. More specifically, the thermal conductivity between the end parts and the middle parts should be preferably in the range of 1,000 and 6,000 W/(m Kelvin). As discussed above, it is useful for obtaining such low electrical resistance and high thermal conductivity that each of the long thin carbon structures making up the bundle of long thin carbon structures be a single long thin carbon structure extending from its interconnected end part to the other end (base part).

The interconnected end parts may also be polished in the bundle of long thin carbon structures of the present invention. In the case of a via or the like, the bundle of long thin carbon structures needs to be prepared to a suitable length in accordance with the depth of the via hole. This can be accomplished by controlling the conditions for preparing the bundle of long thin carbon structures (preparation time for example), but in some cases it may be necessary to polish the interconnected end parts of the long thin carbon structures by CMP (chemical-mechanical polishing) or the like in order to adjust the length or for some other purpose. The interconnected end parts of the bundle of long thin carbon structures of the present invention can be given a thickness of several nm, and all or part of this thickness may be polished.

The bundle of long thin carbon structures of the present invention can be used as an electronic element, exploiting its properties as an electrical conductor, thermal conductor or electrical and thermal conductor. In this case, structures other than the long thin carbon structures (CNT, for example), molecules or atoms may be included among bundles of the long thin carbon structures (CNT bundles, for example), as in the case of the above-mentioned metal-encapsulating fullerenes. It is also possible that structures other than the long thin carbon structures, molecules or atoms may be included among bundles of long thin carbon structures containing metal fullerenes. Moreover, because the end parts have a carbon network as in a graphite sheet, an electronic element can be used in a direction parallel to the end parts.

Specific examples include via wiring, heat removal bumps, passive elements, thermal interface materials and wiring materials and the like.

Figure 6:
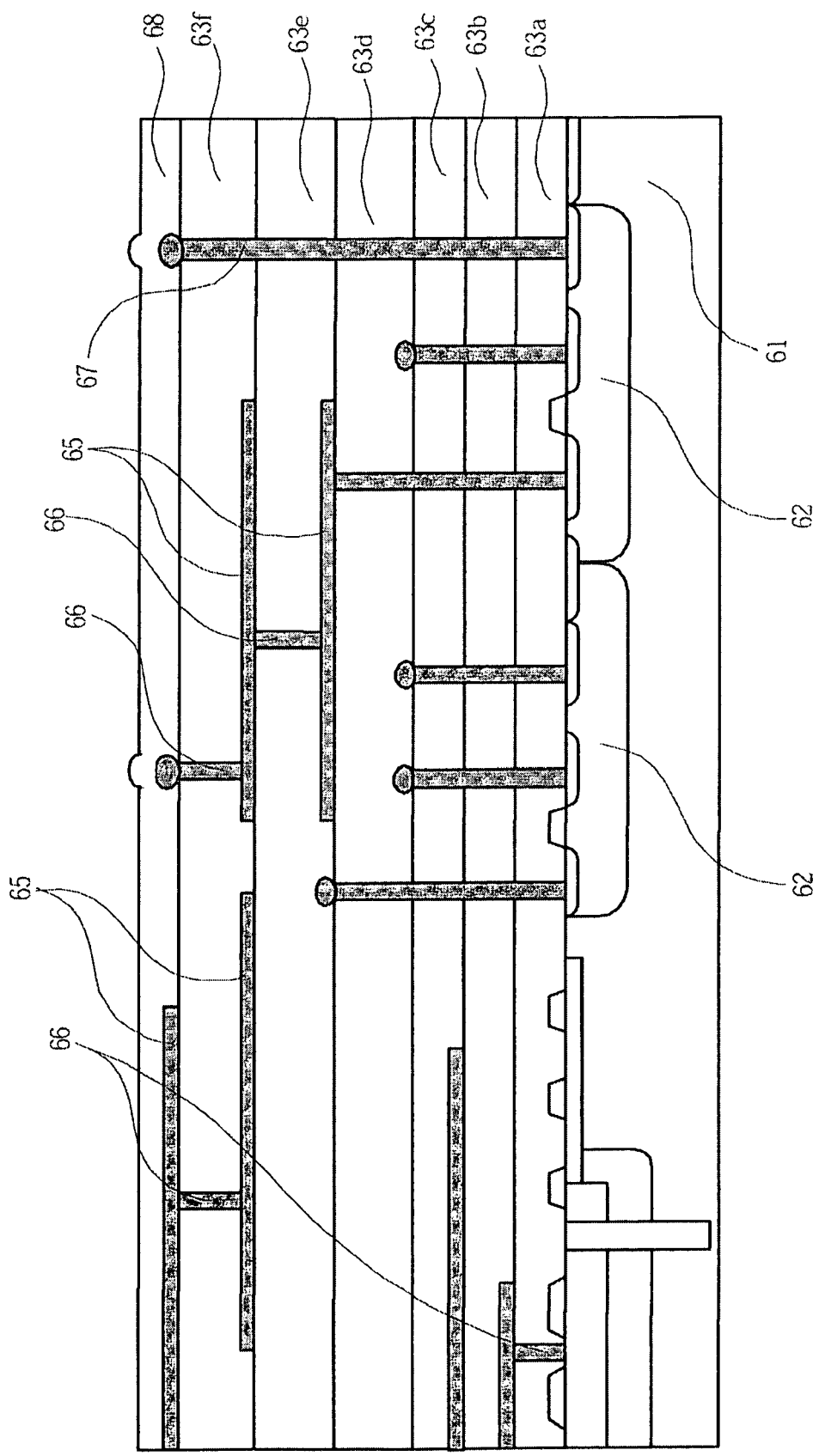
FIG. 6 is a model view showing an electrical connection structure having a via structure using CNTs.

FIG. 6 is a cross-section showing a model view of a semiconductor integrated circuit device using the electrical connection structure of the present invention in vias. In FIG. 6, multiple transistors 62 or other elements are clustered on a silicon substrate 61, with multiple insulating layers (interlayer insulating films) 63a to 63f covering them. Wiring layers are included between the insulating layers, and wires 65 of specific insulating layers are connected to wires 65 of other layers by vias 66 formed through the insulating layers. 67 indicates a contact to a wire 65 that connects elements. The uppermost wiring layer is covered by a protective layer 68. In the integrated circuit device shown in this figure, the electrical connection structure of the present invention can be applied to the vias 66.

Figure 7:
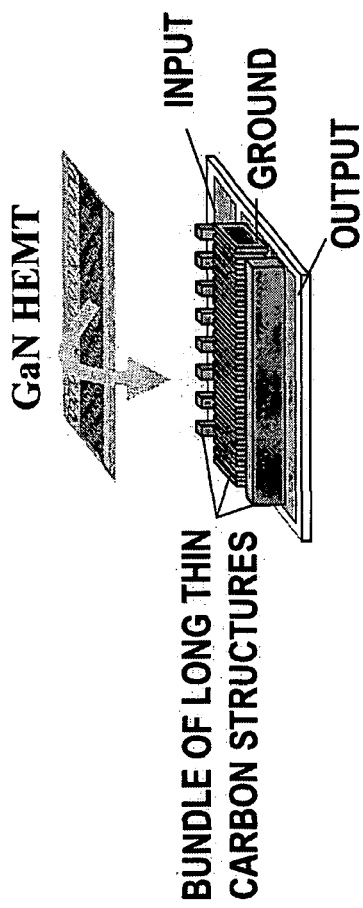
FIG. 7 is a model view showing an example of a heat removal bump.

FIG. 7 is a model view of an example of a heat removal bump. In FIG. 7, electrode patterns for grounding, inputting and outputting are formed on a package substrate, and bundles of long thin carbon structures are formed as heat removal bumps in desired places where catalytic thin films have been patterned on the electrodes. These bundles of long thin carbon structures are gold plated, and a GaN or other high electron mobility transistor (HEMT) is then flip-chip mounted. Inductance is reduced and heat removal is ensured by means of a structure in which the transistor electrodes are directly connected to the package electrodes (the heat removal bumps).

Figure 8:
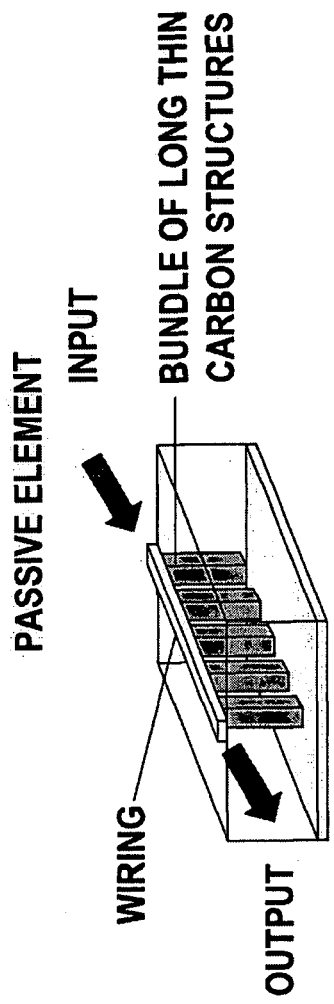
FIG. 8 is a model view showing an example of a passive element.

FIG. 8 is a model view of an example of a passive element. In FIG. 8, bundles of long thin carbon structures are connected along the signal line from input to output. This kind of strip line structure allows the circuit to be miniaturized by reducing the effective wavelength in a high frequency distribution constant circuit (see Japanese Patent Application Laid-open No. 2006-229297).

Figure 9:
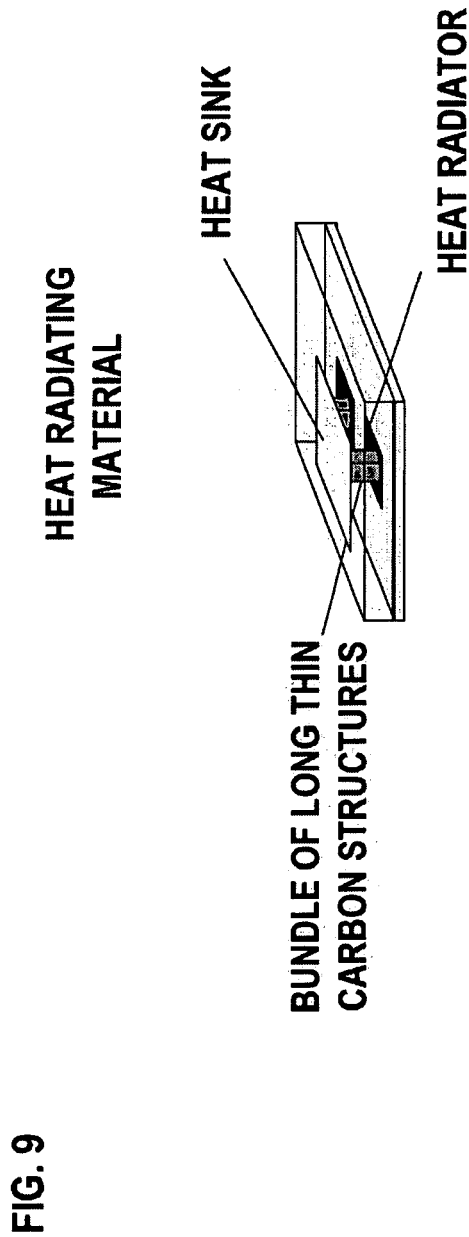
FIG. 9 is a model view showing an example of a thermal interface material.

FIG. 9 shows a model view of an example of a thermal interface material. In FIG. 9, bundles of long thin carbon structures are formed as heat radiators from a heat source to a heat sink with a greater thermal capacity than the heat source as a means of dealing with heat in portable phones, computers and CPUs. In the graphite sheets conventionally used for radiating heat, the thermal conductivity in the direction of thickness is one tenth or less of that in the plane direction. By contrast, the bundles of long thin carbon structures radiate heat better because they have a single structure in the direction of thickness (direction of height), producing a more effective thermal interface structure. Moreover, while ordinary graphite sheets are limited to a thickness of tens of microns, a bundle of long thin carbon structures can be adjusted to any thickness (from tens of nanometers to tens of microns) according to the growth conditions.

Figure 10:
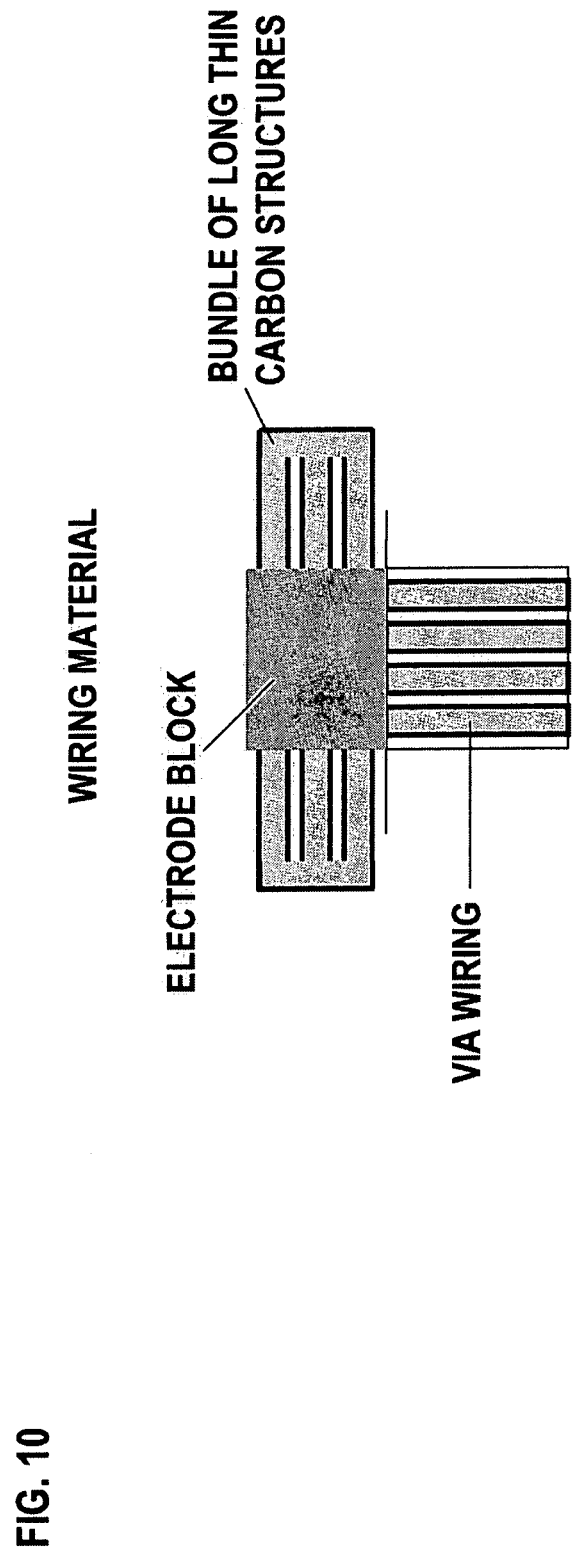
FIG. 10 is a model view showing an example of a wiring material.
Figure 11:
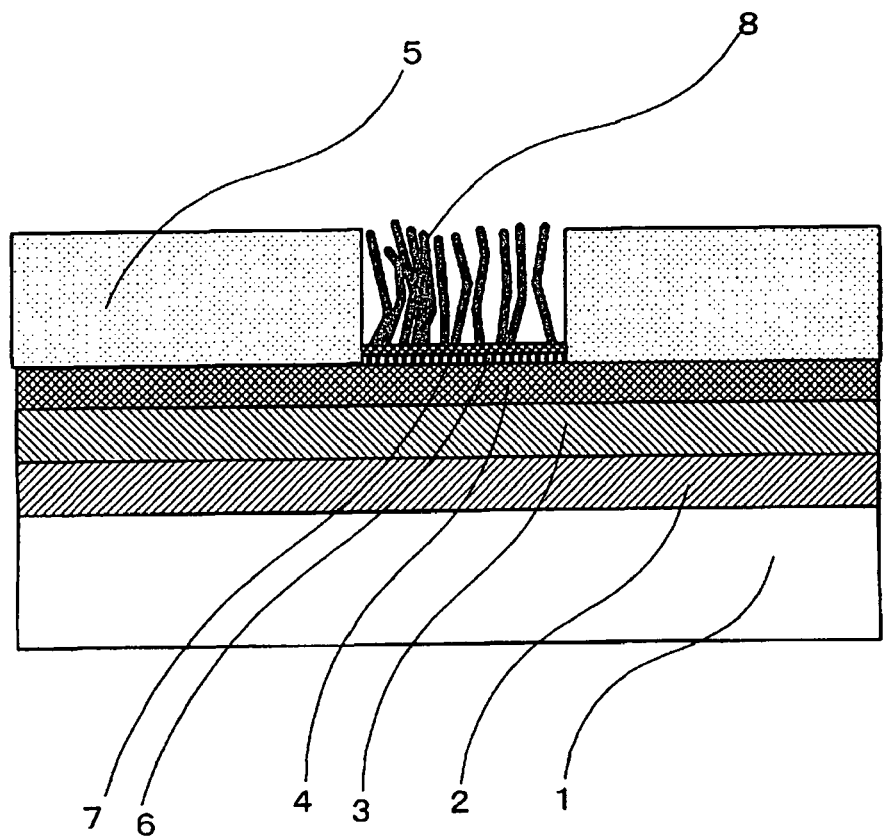
FIG. 11 is a model view showing an electrical connection structure having a via structure using CNTs.

FIG. 10 is a model view showing an example of a wiring material. In FIG. 10, the nanotubes extending from the via wiring are electrically connected via a metal block to horizontal bundles of long thin carbon structures. The nanotubes used in the via wiring may be ordinary CNTs or bundles of long thin carbon structures. Specifically, the tops of the nanotubes used in the via wiring may first be polished to a uniform height, after which the metal block can be formed by copper plating for example, and bundles of long thin carbon structures can then be formed horizontally starting from the block structures. In this way, the bundle of long thin carbon structures of the present invention can be applied not only to via wiring but also to LSI wiring.

EXAMPLES

Examples of the present invention are described below.

Example 1

Catalyst support titanium nitride (TiN) layers and cobalt (Co) layers were prepared with various thicknesses, and long thin carbon structures were grown by thermal CVD. A mixed gas of acetylene and argon (1:9) was introduced into a growth furnace at 1 kPa and at a growth temperature of 510° C. As a result, no long thin carbon structures grew when the Co layer was thick (5 nm for example), and the end parts did not connect to one another in a carbon network when the TiN layer was as thick as 30 nm. These experiments showed that a Co layer thickness of 0.5 to 2 nm and a TiN layer thickness of 2.5 to 15 nm were desirable for obtaining a bundle of long thin carbon structures with the end parts interconnected in a carbon network.

Figure 12:
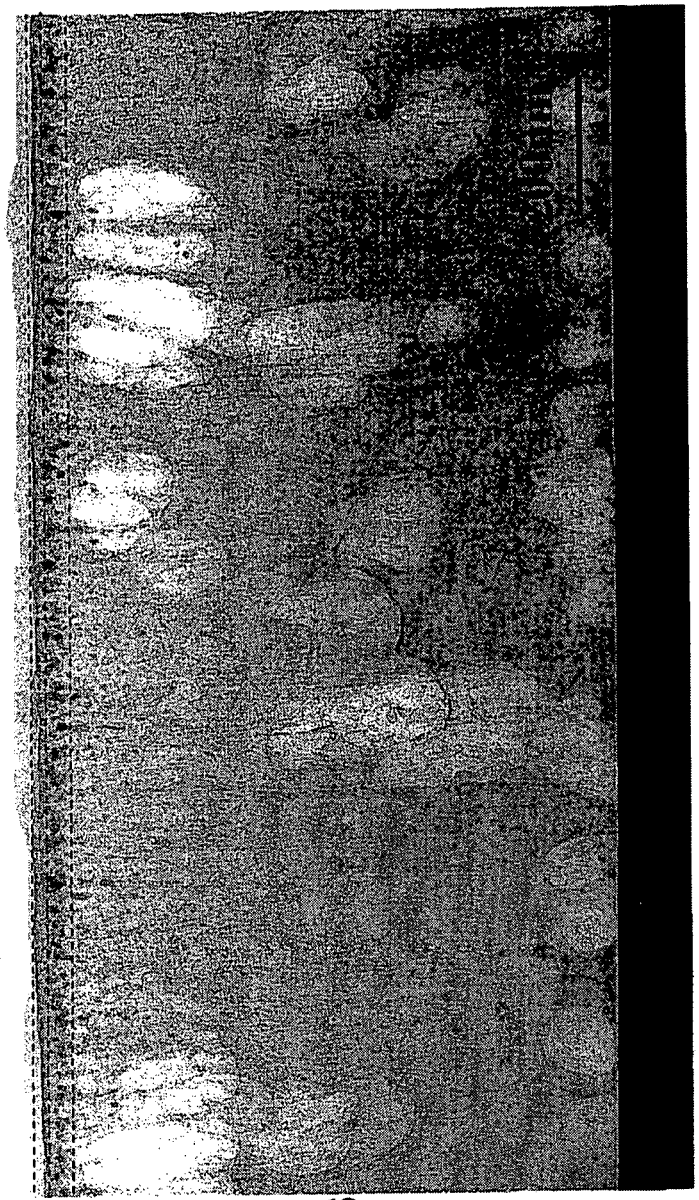
FIG. 12 is a cross-sectional transmission electron microscope image showing the end parts of a bundle of long thin carbon structures interconnected in a carbon network as a result of growth of the bundle of long thin carbon structures.

FIG. 1 shows the initial stage of growth of long thin carbon structures grown using a 1 nm Co layer and a 5 nm Ti N layer, while FIG. 2 shows a scanning electron microscope image of the intermediate stage of growth. It can be seen from these images that interconnected end parts are formed from the initial stage of growth of the long thin carbon structures. FIGS. 3 and 4 are cross-sectional SEM images of a later stage of growth, showing bundles of long thin carbon structures with the end parts interconnected in a carbon network. The growth time was adjusted to show different growth stages. A transmission electron microscope image showing a cross-section of the bundle of long thin carbon structures shown in FIG. 3 or 4 is shown in FIG. 12. FIG. 12 shows clearly that the end parts of the bundle of long thin carbon structures are interconnected, and also shows that the long thin carbon structures below the end parts are multilayer CNTs. The end part structure shown in FIG. 12 is not perfectly understood, but it is ascertained that a multilayer graphite sheet structure with a thickness of about 5 nm is present at the end as is parallel to the substrate, while further from the end parts the graphite sheet becomes perpendicular to the substrate (changes to a multilayer CNT). The graphite sheet structure at the end parts and the lower CNT parts are not independent from one another, but respective graphite sheets are joined in single bodies, appearing to maintain electrical and thermal connections. Finely particulated catalyst can be observed between the end parts and the CNT parts.

When the same bundle of long thin carbon structures was measured by AFM in tapping mode to verify flatness, the average surface roughness (Ra) was shown to be about 3 to 4 nm for an area of 500 nm×500 nm. These results suggest that the end of the bundle of long thin carbon structures is very flat.

It can be seen from these images that the interconnected end parts form a flat surface, and that each of the long thin carbon structures making up the bundle of long thin carbon structures is a single long thin carbon structure extending from its end part to the other end (base part).

Figure 13B:
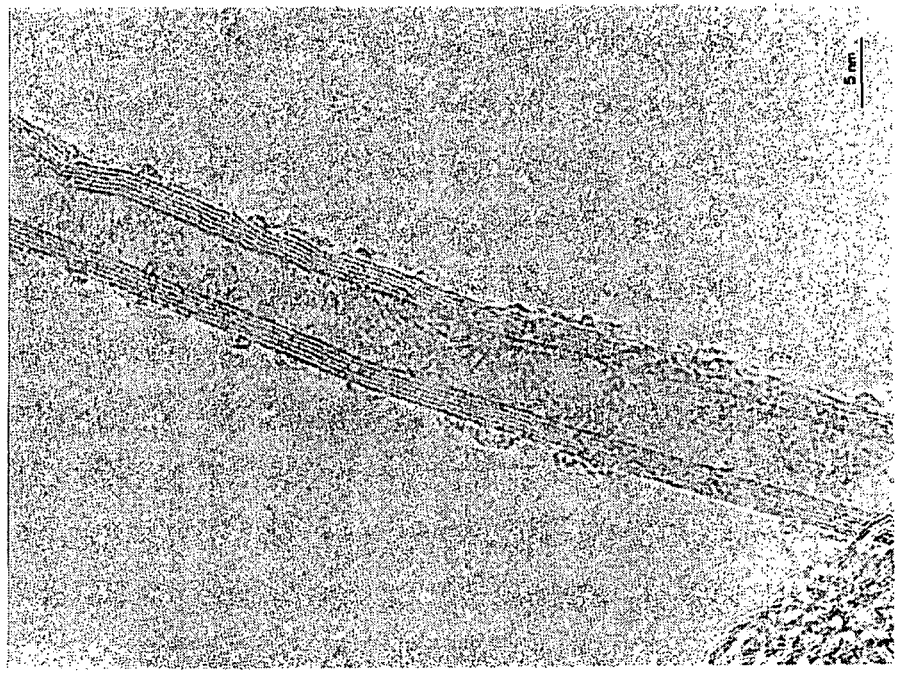
FIG. 13B is a transmission electron microscope image showing the end parts of a bundle of long thin carbon structures interconnected in a carbon network as a result of growth of the bundle of long thin carbon structures at 510° C.
Figure 13A:
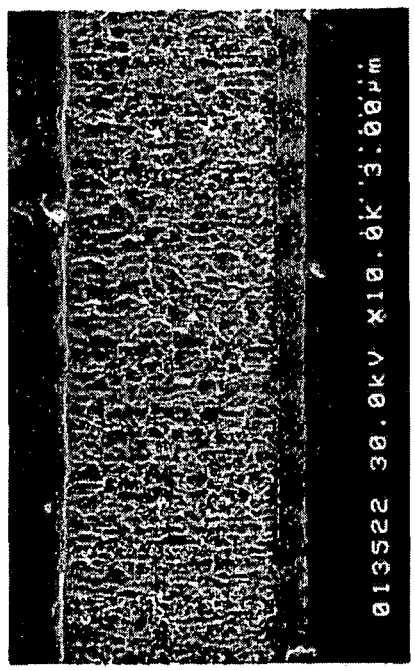
FIG. 13A is a cross-sectional scanning electron microscope image showing the end parts of a bundle of long thin carbon structures interconnected in a carbon network as a result of growth of the bundle of long thin carbon structures at 510° C.
Figure 13A:

FIG. 13A shows a scanning electron microscope image of a long thin carbon structure grown from a 1 nm Co layer and a 10 nm TiN layer. This shows that a similar bundle of long thin carbon structures can be obtained even with a different TiN layer thickness. FIG. 13B shows the results of transmission electron microscope observation of the CNT parts other than the end of the bundle of long thin carbon structures. This shows that the multilayer CNTs have a diameter of about 10 nm, and comprise about 6 to 10 layers.

Example 2

Lower wiring layers of Cu (100 nm) and Ta (15 nm) and a catalyst support layer of TiN (7.5 nm) were deposited continuously on a silicon substrate having a thermally oxidized film, followed by an $SiO_2$ layer. Via holes 2 μm in diameter and 300 nm thick were opened by lithography in the $SiO_2$ layer as far as the TiN catalyst support layer. Since TiN was already present at the bottom of the vias, Co (1 nm) (catalytic thin film layer) was then deposited thereon by sputtering.

Figure 14:
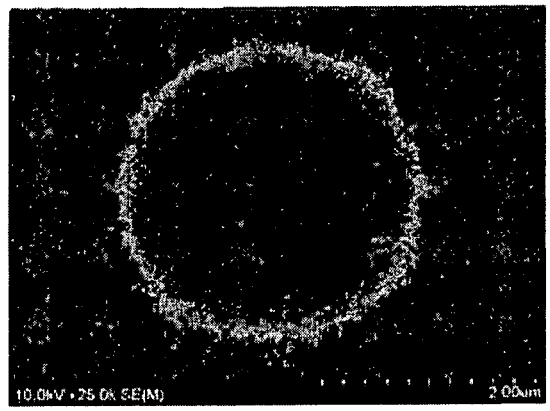
FIG. 14 is a scanning electron microscope image showing a bundle of long thin carbon structures grown from a wiring via hole as seen from above.

A mixed acetylene:argon gas (1:9) was introduced at 1 kPa, 510° C., and long thin carbon structures were grown by CVD. FIG. 14 shows an SEM image of a bundle of long thin carbon structures growing from a via hole. The end parts have a structure interconnected in a carbon network. After bundles of long thin carbon structures had been grown from the via holes, the upper electrode was prepared and the via wiring structure formed by the bundles of long thin carbon structures was measured electrically. The results showed an average value of about 13 Ohm for a 2 μm via. These results strongly support the idea that that the end parts of the bundle of long thin carbon structures are electrically connected to the long thin carbon structures below. A result of 30 Ohm has been obtained with conventional CNTs, and assuming roughly the same CNT density, this suggests that a bundle of long thin carbon structures with a flat end is superior.

Example 3

The CVD growth temperature needs to be further lowered in order to minimize the effect of heating on the interlayer insulating films and transistors when the bundle of long thin carbon structures is applied to the via wiring structure of an LSI. Long thin carbon structures were therefore grown by thermal CVD at lower growth temperatures using a 5 nm TiN layer and a 1 nm Co layer. The growth temperatures were 450° C. and 400° C., and an acetylene/argon mixed gas (1:9) was introduced as the raw material gas into a 1 kPa growth furnace. The mixed gas was further diluted with argon during growth, to an acetylene concentration of 0.005%. As a result, bundles of long thin carbon structures having a structure with the end parts interconnected in a carbon network was obtained at both temperatures. This shows that a bundle of long thin carbon structures can be easily formed even when the growth temperature is reduced.

An electrical connection structure with low resistance and/ or a thermal connection structure with high thermal conductivity can be obtained with the present invention. The bundle of long thin carbon structures of the present invention can be used favorably as an electronic element for various electronic devices, such as high power amplifiers for base stations of mobile communication and satellite communication systems, servers and personal computers, ICs for automotive applications and electric motors drivers for electronic vehicles.

What is claimed is:

1. A method for manufacturing a bundle of a plurality of carbon nanotubes, comprising:
by chemical vapor deposition, fixing a first group of end parts opposite to a second group of free grown end parts of the plurality of carbon nanotubes onto a substrate; and
further growing, by chemical vapor deposition, the free grown end parts of said second group to chemically bond the free grown end parts directly with each other so as to form, from said second group of free grown end groups, a flat graphite wherein the free grown end parts are chemically bonded, while the free grown end parts of said second group are growing by the chemical vapor deposition.

2. The method for manufacturing a bundle of carbon nanotubes according to claim 1, wherein the flat graphite and the middle parts of the bundle of plurality of carbon nanotubes are connected electrically or thermally, or electrically and thermally.

3. The method for manufacturing a bundle of carbon nanotubes according to claim 2, wherein the thermal conductivity between the flat graphite and the middle parts is in a range of 1,000 to 6,000 W/(m Kelvin).

4. The method for manufacturing a bundle of carbon nanotubes according to claim 1, wherein each of the carbon nanotubes is a single long thin carbon structure extending from the end that forms a flat surface to the other end.

5. The method for manufacturing a bundle of carbon nanotubes according to claim 1, wherein each of the carbon nanotubes is a single multilayer carbon nanotube extending from the end that forms a flat surface to the other end.

6. The method for manufacturing a bundle of carbon nanotubes according to claim 1, wherein the carbon nanotubes are synthesized from the catalytic thin film on the catalyst support layer.

7. The method for manufacturing a bundle of carbon nanotubes according to claim 6, wherein the catalytic thin film comprises Co, Ni, Fe or an alloy comprising at least one or more of these.

8. The method for manufacturing a bundle of carbon nanotubes according to claim 6 or 7, wherein the catalyst support layer is a single layer body comprising at least one material selected from the group consisting of Ti, Ta, Mo, Al, HfN, ZrN, TiN, TaN and TiSi, or a multilayer body comprising two or more such layers, each layer comprising at least one material selected from the group consisting of Ti, Ta, Mo, Al, HfN, ZrN, TiN, TaN and TiSi.

9. The method for manufacturing a bundle of carbon nanotubes according to claim 6, wherein a thickness of the catalyst thin film is 0.5-2 nm and a thickness of the catalyst support layer is 2.5-15 nm.

10. The method for manufacturing an electronic device according to claim 1, wherein particulated catalyst is observed between the grown ends and the carbon nanotube parts other than the grown ends.

11. The method for manufacturing an electronic device according to claim 1, wherein the flat graphite has a mean surface roughness (Ra) of 10 nm or less for an area of 500 nm×500 nm as measured by atomic force microscopy (AFM) in tapping mode.

* * * * *